(12) United States Patent
Doan et al.

(10) Patent No.: US 9,129,911 B2
(45) Date of Patent: Sep. 8, 2015

(54) BORON-DOPED CARBON-BASED HARDMASK ETCH PROCESSING

(71) Applicants: Kenny Linh Doan, San Jose, CA (US); Jong Mun Kim, San Jose, CA (US); Daisuke Shimizu, Saratoga, CA (US)

(72) Inventors: Kenny Linh Doan, San Jose, CA (US); Jong Mun Kim, San Jose, CA (US); Daisuke Shimizu, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 14/168,350

(22) Filed: Jan. 30, 2014

(65) Prior Publication Data

US 2014/0213059 A1    Jul. 31, 2014

Related U.S. Application Data

(60) Provisional application No. 61/758,945, filed on Jan. 31, 2013.

(51) Int. Cl.
| | |
|---|---|
| *H01L 21/311* | (2006.01) |
| *H01L 21/3065* | (2006.01) |
| *H01L 21/3213* | (2006.01) |
| *H01L 21/306* | (2006.01) |
| *H01L 21/033* | (2006.01) |
| *H01L 21/308* | (2006.01) |

(Continued)

(52) U.S. Cl.
CPC .... *H01L 21/31122* (2013.01); *H01L 21/02115* (2013.01); *H01L 21/0337* (2013.01); *H01L 21/3065* (2013.01); *H01L 21/3086* (2013.01); *H01L 21/30621* (2013.01); *H01L 21/3146* (2013.01); *H01L 21/31116* (2013.01); *H01L 21/31138* (2013.01); *H01L 21/31144* (2013.01); *H01L 21/32136* (2013.01); *H01L 21/32139* (2013.01)

(58) Field of Classification Search
CPC ............... H01L 21/3065; H01L 21/32136; H01L 21/30621; H01L 21/31138; H01L 21/0337; H01L 21/3086; H01L 21/3146; H01L 21/02115; H01L 21/31116
See application file for complete search history.

(56) References Cited

U.S. PATENT DOCUMENTS

| | | | |
|---|---|---|---|
| 8,133,819 B2 | 3/2012 | Wang et al. | |
| 8,778,207 B2 | 7/2014 | Kim et al. | |
| 2002/0090827 A1* | 7/2002 | Yokoshima | 438/714 |

(Continued)

FOREIGN PATENT DOCUMENTS

| | | |
|---|---|---|
| KR | 10-0322695 | 5/2002 |
| KR | 10-0468700 | 3/2005 |
| KR | 10-1170861 | 8/2012 |

OTHER PUBLICATIONS

U.S. Appl. No. 13/651,047, filed Oct. 12, 2012, 29 pgs.

(Continued)

*Primary Examiner* — Lan Vinh
*Assistant Examiner* — Jiong-Ping Lu
(74) *Attorney, Agent, or Firm* — Blakely Sokoloff Taylor Zafman LLP

(57) ABSTRACT

Boron-doped carbon-based hardmask etch processing is described. In an example, a method of patterning a film includes etching a boron-doped amorphous carbon layer with a plasma based on a combination of $CH_4/N_2/O_2$ and a flourine-rich source such as, but not limited to, $CF_4$, $SF_6$ or $C_2F_6$.

18 Claims, 5 Drawing Sheets

(51) Int. Cl.
*H01L 21/314* (2006.01)
*H01L 21/02* (2006.01)

(56) References Cited

U.S. PATENT DOCUMENTS

| | | |
|---|---|---|
| 2003/0075524 A1 | 4/2003 | Kawaguchi et al. |
| 2004/0084412 A1 | 5/2004 | Waldfried et al. |
| 2004/0144491 A1 | 7/2004 | Ohuchi et al. |
| 2006/0231524 A1* | 10/2006 | Liu et al. .................. 216/41 |
| 2007/0080136 A1 | 4/2007 | Takata et al. |
| 2007/0245959 A1 | 10/2007 | Paterson et al. |
| 2008/0067583 A1 | 3/2008 | Kidoh et al. |
| 2009/0212010 A1 | 8/2009 | Wang et al. |
| 2011/0031216 A1 | 2/2011 | Liao et al. |
| 2011/0306214 A1 | 12/2011 | Zin |
| 2012/0080779 A1* | 4/2012 | Seamons et al. .............. 257/635 |
| 2013/0059450 A1 | 3/2013 | Le Gouil et al. |
| 2013/0109188 A1 | 5/2013 | Kim et al. |
| 2013/0279066 A1 | 10/2013 | Lubomirsky et al. |

OTHER PUBLICATIONS

International Search Report and Written Opinion from PCT/US14/12592 mailed May 20, 2014, 10 pages.

International Search Report and Written Opinion for Application No. PCT/US2013/066953 dated Feb. 25, 2014, 11 pages.

"H. Xiao, Introduction to Semiconductor Manufacturing Technology, published by Prentice Hall, 2001, ISBN 0-13-022404-9, pp. 354-356".

"S. Wolf and R.N. Tauber, Silicon Processing for the VLSI Era, vol. 1, Lattice Press, ISBN 0-9616721-6-1, year 2000, pp. 673-675".

Howard, Brad, "Applied Centura Avatar Etch Enabling New Dimensions in High Aspect Ratio Etching," Silicon Systems Group, Jun. 27, 2012, 20 pages.

Non-Final Office Action from U.S. Appl. No. 14/157,997 mailed Jan. 12, 2015, 17 pgs.

* cited by examiner

400

| Parameters | ER | TCDs | Profile | SiON Sel. |
|---|---|---|---|---|
| $N_2$ | ↓ | ↓ | Taper | ↓ |
| $CH_4$ | — | ↑↑ | Taper | ↓↓ |
| Pressure | ↑↑ | ↑↑ | Vertical | ↓ |
| $W_S$ | ↓ | ↓↓ | Taper | ↑↑ |
| $W_{60}$ | ↓ | ↓ | — | — |
| $W_2$ | ↑↑ | — | Taper | ↓ |
| Wfr Temp. | | | | ↑↑ |

FIG. 4

BORON-DOPED CARBON-BASED HARDMASK ETCH PROCESSING

CROSS-REFERENCE TO RELATED APPLICATIONS

This application claims the benefit of U.S. Provisional Application No. 61/758,945, filed on Jan. 31, 2013, the entire contents of which are hereby incorporated by reference herein.

BACKGROUND

1) Field

Embodiments of the present invention pertain to the field of semiconductor processing and, in particular, to boron-doped carbon-based hardmask etch processing.

2) Description of Related Art

As the feature size of the device patterns get smaller, the critical dimension (CD) requirement of features becomes a more important criterion for stable and repeatable device performance. Allowable CD variation across a substrate has also scaled with the scaling of feature CD. With lateral dimensions scaling faster than vertical dimensions, because of issues such as device capacitance, high aspect ratios (HAR) are now prevalent in the industry. When such demanding aspect ratios and CD control are compounded with requirements of high etch selectivity, sidewall smoothness and high tool throughput, the process window for any hardware configuration can become very small. In many situations, a small process window can be found only when a number of process gases are incorporated into a complex etchant gas mixture combined with extreme hardware settings, such as very high RF bias powers, to achieve a fragile balance between sidewall passivation, etch rate and mask selectivity. However, such small process windows typically suffer from performance limitations which cannot be tuned out of the etch process with known means.

Fabrication techniques often now employ a mask stack that includes non-photo definable material layers disposed below a photo definable layer (i.e., photo resist). The non-photo definable material layers may include a carbonaceous layer, which may be of an inorganic material comprising at least 20 wt % carbon. Included in this class of materials is amorphous carbon, typically comprising greater than 50 wt % carbon, and low-k dielectrics comprising at least 20 wt % carbon content. While improved HAR etch performance is achieved with such carbonaceous masking layers, even greater etch resistance may be provided in boron-doped carbonaceous layers, which include between 1 wt. % and 40 wt. % boron (B). One example of such a boron-doped carbonaceous material is available from Applied Materials, Inc. of Santa Clara, Calif. under the trade name of advanced patterning film (APF), more specifically "APFc."

While a boron-doped carbonaceous mask layer provides improved mask resistance to plasma processes employed to etch an underlying substrate layer (e.g., an interlayer dielectric layer (ILD), and therefore permit an aspect ratio of an opening forming in the underlying layer to be reduced through a thinning of the mask stack, this improved resistance to etching processes also renders the initial opening of the boron-doped carbonaceous layer by a plasma etch "mask open" process more difficult than for boron-free carbonaceous masking layers.

A plasma etch "mask open" process tailored to the etching of a boron-doped carbonaceous layer, such as APFc, is therefore advantageous.

SUMMARY

One or more embodiments of the present invention are directed to boron-doped carbon-based hardmask etch processing.

In an embodiment, a method of patterning a film includes etching a boron-doped amorphous carbon layer with a plasma based on a combination of $CH_4/N_2/O_2$ and a flourine-rich source such as, but not limited to, $CF_4$, $SF_6$ or $C_2F_6$.

In an embodiment, a method of patterning a film involves etching a boron-doped amorphous carbon layer with a plasma based on a combination of $CH_4/N_2/O_2$ and a flourine-rich source such as, but not limited to, $CF_4$, $SF_6$ or $C_2F_6$. The etching involves etching with a first set of plasma conditions using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar, at a pressure of approximately 10 mTorr, and with a combination of biases at 2 MHz, 60 MHz and 162 MHz performed at powers of approximately 200 W, 200 W and 100 W, respectively. The method then involves etching with a second set of plasma conditions using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar, at a pressure of approximately 10 mTorr, and with a combination of biases at 2 MHz, 60 MHz and 162 MHz performed at powers of approximately 200 W, 200 W and 2300 W, respectively.

In an embodiment, a non-transitory machine-accessible storage medium has instructions stored thereon which cause a data processing system to perform a method of boron-doped carbon-based hardmask etch processing. The method includes etching a boron-doped amorphous carbon layer with a plasma based on a combination of $CH_4/N_2/O_2$ and a flourine-rich source such as, but not limited to, $CF_4$, $SF_6$ or $C_2F_6$.

BRIEF DESCRIPTION OF THE DRAWINGS

FIG. 4 is a Table of parameters that may be tailored for a boron-doped carbon-based hardmask etching process and the respective etch characteristic responses, in accordance with an embodiment of the present invention.

DETAILED DESCRIPTION

Boron-doped carbon-based hardmask etch processing is described. In the following description, numerous specific details are set forth, such as specific plasma treatments and material stacks including a boron-doped carbon-based hardmask layer, in order to provide a thorough understanding of embodiments of the present invention. It will be apparent to one skilled in the art that embodiments of the present invention may be practiced without these specific details. In other instances, well-known aspects, such as photolithography patterning and development techniques for photoresist mask formation, are not described in detail in order to not unnecessarily obscure embodiments of the present invention. Furthermore, it is to be understood that the various embodiments shown in the Figures are illustrative representations and are not necessarily drawn to scale.

One or more embodiments described herein relate to plasma etch processes for boron-doped carbonaceous mask layers. In specific embodiments, a new class of gas chemistry for plasma etching of boron doped hardmask opening is described.

To provide context, it has been recognized that boron doping of carbon rich hard masks greatly enhances selectivity for mask layer etching. This can enable improvements in critical dimensions (CDs) by reducing distortion, etc. However, the inventors have discovered that boron-doped carbon rich hardmask materials can be significantly more difficult to etch versus conventional carbon rich hardmask materials. Accordingly, one or more embodiments described herein involve a combination of gases for processing with very high selectivity to other present materials, such as SiON, and can provide essentially vertical profiles. One or more embodiments address the need to use hardmask materials more sophisticated than convention materials, yet more difficult to etch with suitable selectivity to substrates and/or other surrounding layers.

Figure 1:
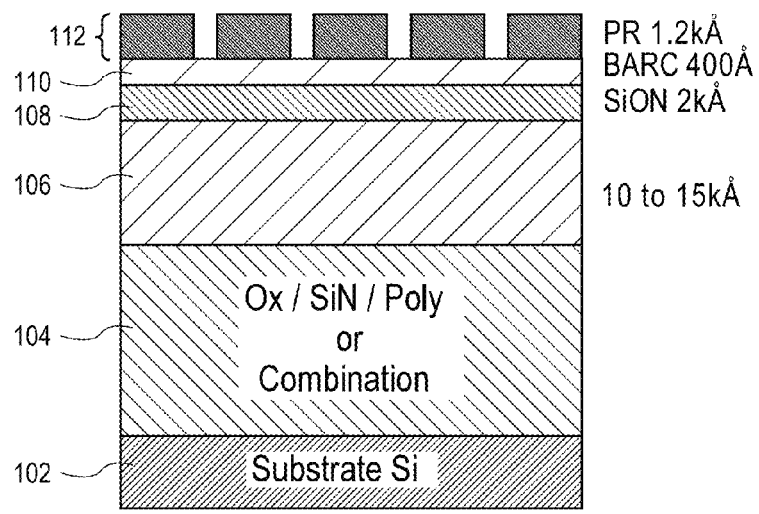
FIG. 1 illustrates a cross-sectional view of an exemplary material stack including a boron-doped carbon-based hardmask layer, in accordance with an embodiment of the present invention.

FIG. 1 illustrates a cross-sectional view of an exemplary material stack including a boron-doped carbon-based hardmask layer, in accordance with an embodiment of the present invention.

Referring to FIG. 1, a boron-doped carbonaceous layer, such as a boron-rich amorphous carbon layer 106 (e.g., 1-1.5 microns of "Saphira" in FIG. 1) is formed above a substrate 102, such as a silicon substrate. As used herein, a boron-doped carbonaceous layer includes inorganic layers composed of at least 1 wt % boron and at least 20 wt % carbon. Included in this class of materials is boron-rich amorphous carbon, typically composed of greater than 25 wt % boron and 50 wt % carbon. Excluded from the "boron-doped carbonaceous" class of materials are organic materials having a total carbon content less than 20 wt %, such as those commonly employed as bottom anti-reflective coating (BARC) layers, which typically include polyamides and polysulfones and have less than 5 wt % carbon, even if such materials have an appreciable amount of boron although they typically do not incorporate any boron.

The boron-doped carbonaceous layer may be formed with spray on/spin on methods, with a thermal deposition process (CVD), or a plasma enhanced deposition process (PECVD). In an embodiment, a boron-rich amorphous carbon layer is deposited with either CVD or PECVD to form a carbon material composed of at least 50 wt % carbon with sp1, sp2 and sp3 bonding states giving the film properties which are a hybrid of those typical of pyrolylic, graphitic, and diamond-like carbon. Because the deposited boron-doped carbon material may contain a plurality of bonding states in various proportions, it lacks long range order and so is commonly referred to as "amorphous carbon." In particular embodiments, the boron-doped amorphous carbon layer may be formed with a PECVD process using hydrocarbon precursors, such as, but not limited to, methane ($CH_4$), propylene ($C_3H_6$), propyne ($C_3H_4$), propane ($C_3H_8$), butane ($C_4H_{10}$), butylenes ($C_4H_8$), butadiene ($C_4H_6$), acetylene ($C_2H_2$), toluene ($C_7H_8$ ($C_6H_5CH_3$)) and mixtures thereof with a boron source, such as, but not limited to diborane ($B_2H_6$). The boron-doped amorphous carbon layer may also include nitrogen or other additives. An exemplary boron-doped amorphous carbon material is commercially available from Applied Materials, Inc., CA, U.S.A. under the trade name Advanced Patterning Film™ (APF), and more particularly a species of the APF genus of materials known as APFc, which is boron doped.

In an embodiment, the boron-doped amorphous carbon layer 106 of FIG. 1 is not photosensitive and is instead patterned with a plasma etch to reproduce with high fidelity a pattern of an overlying photosensitive layer. The boron-doped amorphous carbon layer is formed with a thickness dependent the material's resistance to the process used to subsequently pattern a substrate layer and the structural integrity of the boron-doped carbon material (limiting the aspect ratio of the amorphous carbon layer). In one embodiment, the boron-doped amorphous carbon layer has a thickness, which is approximately 3 times greater than the critical dimension of a feature to be subsequently etched into the layer for an aspect ratio of 3:1. In a further embodiment, the ratio of boron-doped amorphous carbon layer thickness to feature dimension is between 1:1 and 4:1. Such a range of ratios will provide adequate structural integrity so that patterned amorphous carbon features will not collapse during subsequent processing. In one such embodiment, the boron-doped amorphous carbon layer is between approximately 100 nm and approximately 1500 nm.

As also depicted in FIG. 1, the boron-doped amorphous carbon layer can be capped with an inorganic dielectric cap layer 108 (e.g., the 200 nm SiON layer of FIG. 1). The inorganic dielectric cap layer may serve as a dielectric anti-reflective layer (DARC) and/or improve adhesion of subsequent organic films applied by spin on techniques, which may otherwise not adhere well to the boron-doped amorphous carbon layer. The inorganic dielectric cap layer may be a single film or a multi-layered stack of films composed of at least silicon and typically further including nitrogen and/or oxygen to form a silicon dioxide, silicon nitride or silicon oxy-nitride (SiON). The composition and thickness of the cap layer may also be tuned to provide minimal reflections and high contrast for a particular wavelength employed during photolithographic patterning of features. In exemplary embodiments, the inorganic dielectric cap layer is formed to a thickness of between about 25 nm and 100 nm, and more particularly between 35 nm and 65 nm.

As further illustrated in FIG. 1, a patterned photoresist (PR) layer 112 is depicted following a photolithography operation. In some photoresist embodiments, an organic bottom anti-reflective coating 110 (e.g., 40 nm BARC layer of FIG. 1) is applied on the inorganic dielectric cap layer 108 to further reduce reflection of light during patterning of the photosensitive layer. The BARC is typically composed of polyamides and polysulfones. While it may be unnecessary to have both an organic BARC and the inorganic dielectric cap layer over the amorphous boron-doped carbon layer, the exemplary embodiment includes a BARC layer.

The patterned photoresist layer above the boron-doped amorphous carbon layer may be patterned with any conventional means, such as with known photolithography techniques and suitable known resist compositions. In one embodiment, the patterned photoresist includes a contact opening having a critical dimension below about 30 nm. In a specific implementation, the patterned photoresist forms a contact opening having a critical dimension between approximately 10 nm and 30 nm.

Figure 2:
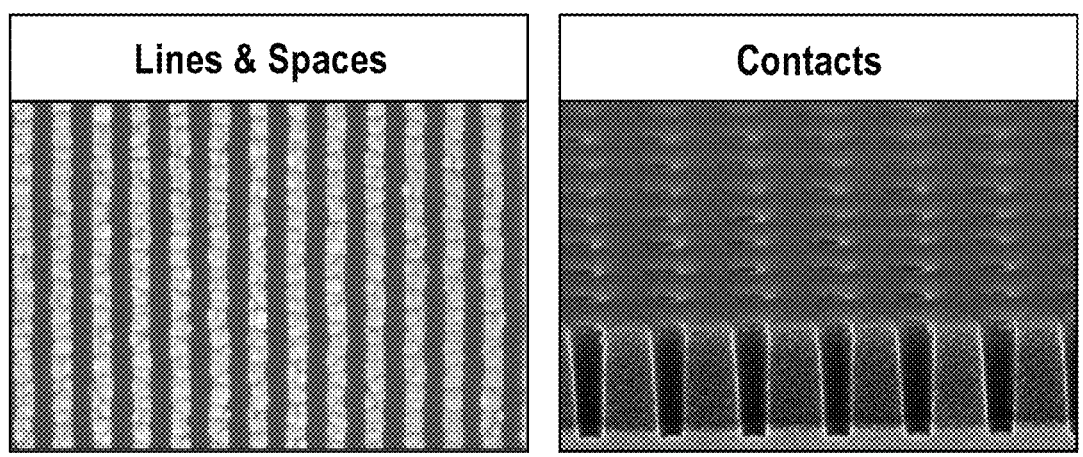
FIG. 2 illustrates exemplary applications of a boron-doped carbon-based hardmask, namely to form lines and spaces or to form contact structures, in accordance with an embodiment of the present invention.

Layers 104 underlying the boron-doped carbon-based hardmask layer of FIG. 1 may include oxide layers, silicon nitride layers, polysilicon layers, or other material layers used in semiconductor processing. Referring to FIG. 2, in accordance with an embodiment of the present invention, a boron-doped carbon-based hardmask is used to form lines and spaces (e.g., for gate patterning or metallization interconnect patterning) or to form contact structures. Thus, it is to be understood that a complete film stack could also include underlying front of line (FEOL) device layers, such as transistor layers, as well as underlying BEOL metal layers.

Figure 3A:
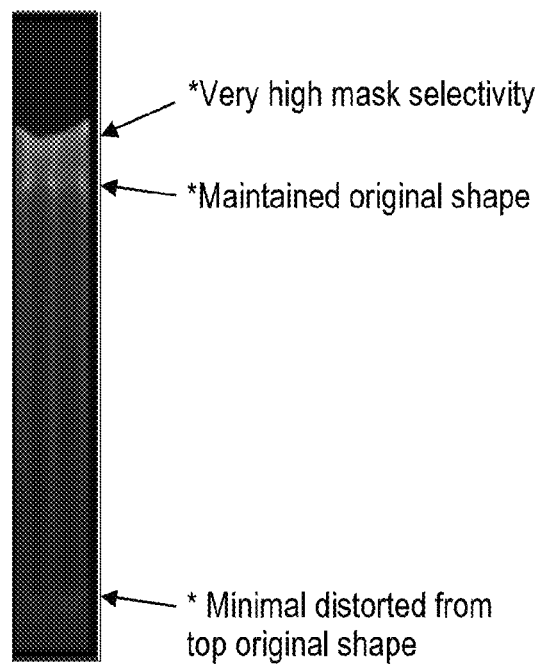
FIGS. 3A and 3B are cross-sectional scanning electron microscope (SEM) images of a material stack such as the material stack of FIG. 1 with a pattern etched therein, in accordance with an embodiment of the present invention.
Figure 3B:
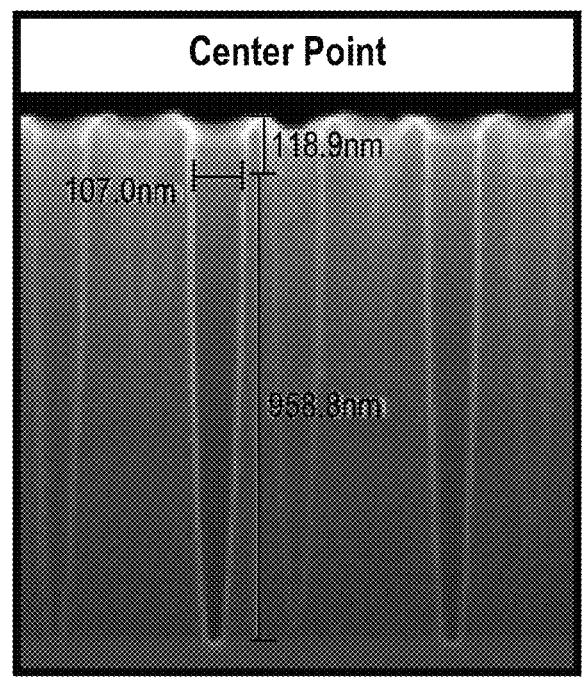

FIGS. 3A and 3B are cross-sectional scanning electron microscope (SEM) images of a material stack such as the material stack of FIG. 1 with a pattern etched therein, highlighting the benefits of using a boron-doped carbon-based hardmask for small feature formation, in accordance with an embodiment of the present invention. As can be seen, especially combined with etch conditions as described herein, benefits or advantages can include very high mask selectivity, maintaining of original profile shapes, and minimal distortion at bottom of the top original shape.

Returning to FIG. 1, and in reference to FIGS. 3A and 3B, an inorganic dielectric cap layer can first be etched. In one embodiment, the inorganic dielectric cap layer is plasma etched with a conventional halogen-based chemistry, including gases such as, but not limited to fluorocarbons including $C_xF_y$ (e.g., $CF_4$, $C_2F_6$, $C_4F_8$, $C_4F_6$, $C_5F_8$, etc.) and/or $C_xH_yF_z$ (e.g., $CHF_3$, $CH_2F_2$, $CHF_3$, etc.) species. Mixtures including one or more of these may be combined with or without $N_2$. In a further embodiment, the fluorocarbon etchant gas is energized with a low frequency "bias power" RF generator, having a frequency below about 50 MHz, such as the 13.56 MHz and 2 MHz bands. In a further embodiment, high frequency "source power" RF generation, having a frequency above about 100 MHz is preferentially avoided during opening of the inorganic dielectric cap layer to minimize etch bias. A BARC layer, if present, may also be plasma etched with a substantially similar plasma etch process, such that both the organic BARC layer and the inorganic dielectric cap layer may be etched in a single plasma etch process. The duration of such an etch operation is dependent on the thickness of the cap layer(s), but, in one embodiment, a 500 nm inorganic dielectric cap layer is cleared in about 50 seconds.

Returning again to FIG. 1, and in reference again to FIGS. 3A and 3B, following opening of the inorganic cap layer and/or the BARC layer, the boron-doped amorphous carbon layer (e.g., Saphira) is plasma etched with a combination of $CH_4/N_2/O_2$ and a flourine-rich source, such as $CF_4$, $SF_6$, $C_2F_6$, etc. The added flourine-rich source may aid with removal of boron from the film, e.g., to form volatile species $BF_x$, $BH_xF_y$, etc. In one such embodiment, the boron-doped amorphous carbon layer is etched with a bias that is increased part way through the etch. For example, in a specific embodiment, the etch begins at a pressure of approximately 10 mTorr, a combination of biases at 2 MHz, 60 MHz and 162 MHz performed at powers of approximately 200 W, 200 W and 100 W, respectively, and a chemistry based on COS (approximately 40 sccm), $O_2$ (approximately 105 sccm) $CF_4$ (approximately 20 sccm), $N_2$ (approximately 20 sccm), $CH_4$ (approximately 50 sccm), and Ar (approximately 100 sccm).

The etch then continues through to completion at a pressure of approximately 10 mTorr, a combination of biases at 2 MHz, 60 MHz and 162 MHz performed at powers of approximately 200 W, 200 W and 2300 W, respectively, and a chemistry based on COS (approximately 40 sccm), $O_2$ (approximately 105 sccm) $CF_4$ (approximately 20 sccm), $N_2$ (approximately 20 sccm), $CH_4$ (approximately 50 sccm), and Ar (approximately 100 sccm).

Applications of the above described etch processes for a boron-doped carbon-based hardmask layer include the fabrication of essentially vertical profiles for a mask open process. The etching regimes can provide high selectivity to other exposed materials such as silicon oxynitride (SiON) layers that are present as masking layers for hardmask patterning. Additionally, reasonable fast etch rates may be obtained, ensuring that the etching process is reasonable on a production scale.

Parameters of the above described etching regimes can be varied to tailor the characteristic of an actual etch process as needed, example of which follow. It is to be understood that the following is a list of considerations, and actual process response will depend on boron (B+) doping levels in the carbon-based hardmask layer, contact sizes, aspect ratio, etc. FIG. 4 is a Table 400 of parameters that may be tailored for a boron-doped carbon-based hardmask etching process and the respective etch characteristic responses, in accordance with an embodiment of the present invention. Referring to Table 400, increasing nitrogen ($N_2$) in the etch gases can lower etch rate (ER), lower trench critical dimensions (TCDs), taper the etch profile, and reduce selectivity to SiON etching. Increasing methane ($CH_4$) in the etch gases does not significantly impact ER, significantly increases TCDs, tapers the etch profile, and significantly reduces selectivity to SiON etching. Increasing pressure of the etch gases significantly increases ER, significantly increases TCDs, renders a more vertical etch profile, and reduces selectivity to SiON etching. Increasing source power ($W_S$) of the etchant can lower ER, significantly lower TCDs, taper the etch profile, and significantly increase selectivity to SiON etching. Increasing 60 MHz power ($W_{60}$) of the etchant can lower ER, lower TCDs, not significantly impact the etch profile, and not significantly impact selectivity to SiON etching. Increasing 2 MHz power ($W_2$) of the etchant can significantly increase ER, not significantly impact TCDs, taper the etch profile, and decrease selectivity to SiON etching. Increasing wafer temperature during etching can significantly increase selectivity to SiON etching.

Boron-doped carbon-based hardmask etch processing may be conducted in processing equipment suitable to provide an etch plasma in proximity to a sample for etching. For example, 5 illustrates a system in which a method of boron-doped carbon-based hardmask etch processing can be performed, in accordance with an embodiment of the present invention.

Figure 5:
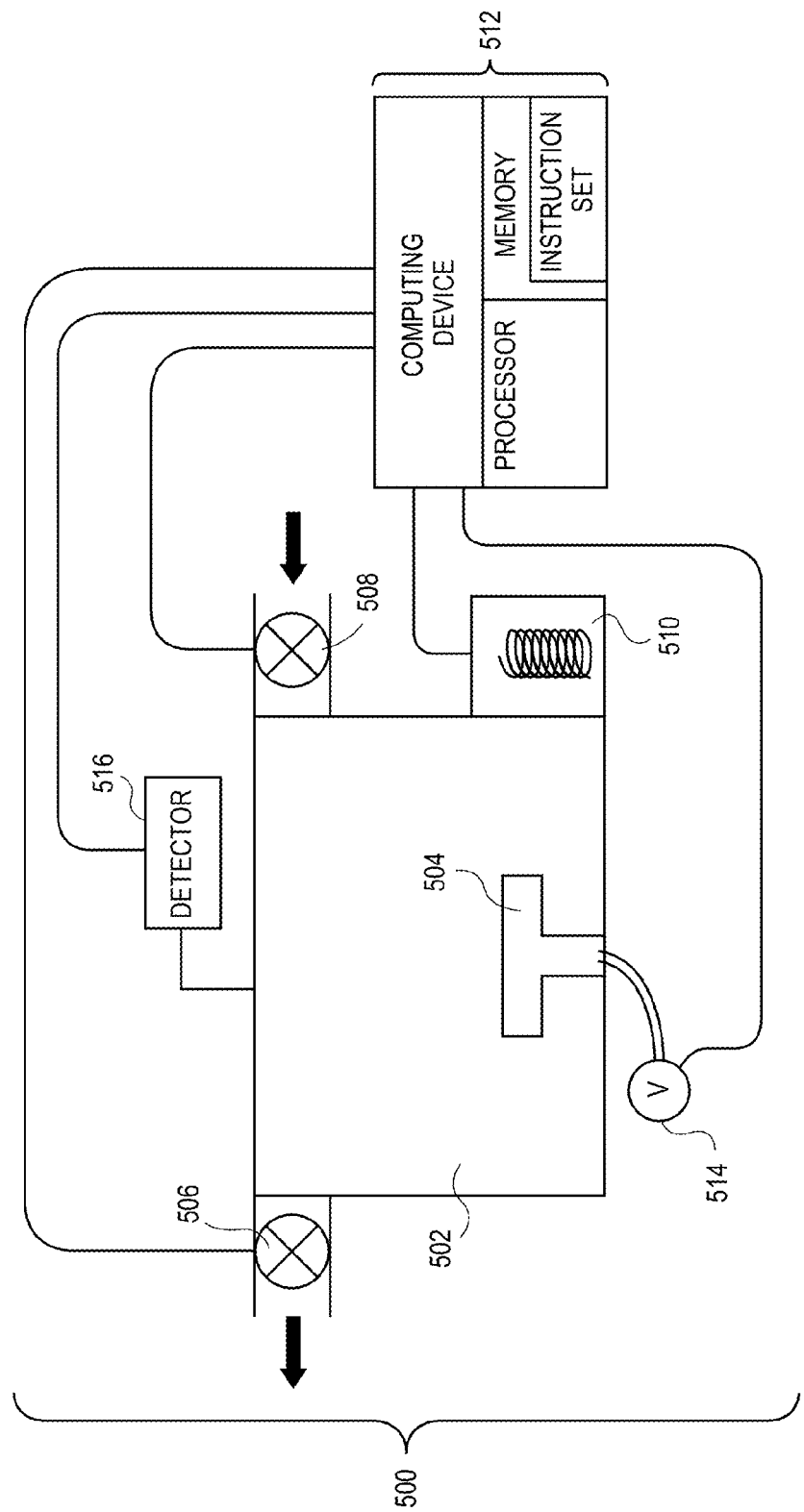
FIG. 5 illustrates a system in which a method of boron-doped carbon-based hardmask etch processing can be performed, in accordance with an embodiment of the present invention.

Referring to FIG. 5, a system 500 for conducting a plasma etch process includes a chamber 502 equipped with a sample holder 504. An evacuation device 506, a gas inlet device 508 and a plasma ignition device 510 are coupled with chamber 502. A computing device 512 is coupled with plasma ignition device 510. System 500 may additionally include a voltage source 514 coupled with sample holder 904 and a detector 516 coupled with chamber 502. Computing device 512 may also be coupled with evacuation device 506, gas inlet device 508, voltage source 514 and detector 516, as depicted in FIG. 5.

Chamber 502 and sample holder 504 may include a reaction chamber and sample positioning device suitable to contain an ionized gas, i.e. a plasma, and bring a sample in proximity to the ionized gas or charged species ejected therefrom. Evacuation device 506 may be a device suitable to evacuate and de-pressurize chamber 502. Gas inlet device 508 may be a device suitable to inject a reaction gas into chamber 502. Plasma ignition device 510 may be a device suitable for igniting a plasma derived from the reaction gas injected into chamber 502 by gas inlet device 508. Detection device 516 may be a device suitable to detect an end-point of a processing operation. In one embodiment, system 500 includes a chamber 502, a sample holder 504, an evacuation device 506, a gas inlet device 508, a plasma ignition device 510 and a detector 516 similar to, or the same as, those included in an Applied Centura® Enabler dielectric etch system, an Applied Materials™ AdvantEdge G3 system, or an Applied Materials™ C3 dielectric etch chamber.

In an embodiment, a boron-doped carbon-based hardmask etch process is performed in chamber such as chamber 500. The recipe can involve one or both of the following operations 1-2. In one such embodiment, both operations 1-2 are performed in the sequence provided below and in a single pass in a chamber.

Operation 1 is a first etch portion performed at a pressure of approximately 10 mTorr, a combination of biases at 2 MHz, 60 MHz and 162 MHz performed at powers of approximately 200 W, 200 W and 100 W, respectively, and a chemistry based on COS (approximately 40 sccm), $O_2$ (approximately 105 sccm) $CF_4$ (approximately 20 sccm), $N_2$ (approximately 20 sccm), $CH_4$ (approximately 50 sccm), and Ar (approximately 100 sccm).

Operation 2 is a second etch portion performed at a pressure of approximately 10 mTorr, a combination of biases at 2 MHz, 60 MHz and 162 MHz performed at powers of approximately 200 W, 200 W and 2300 W, respectively, and a chemistry based on COS (approximately 40 sccm), $O_2$ (approximately 105 sccm) $CF_4$ (approximately 20 sccm), $N_2$ (approximately 20 sccm), $CH_4$ (approximately 50 sccm), and Ar (approximately 100 sccm).

Embodiments of the present invention may be provided as a computer program product, or software, that may include a machine-readable medium having stored thereon instructions, which may be used to program a computer system (or other electronic devices) to perform a process according to the present invention. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 6:
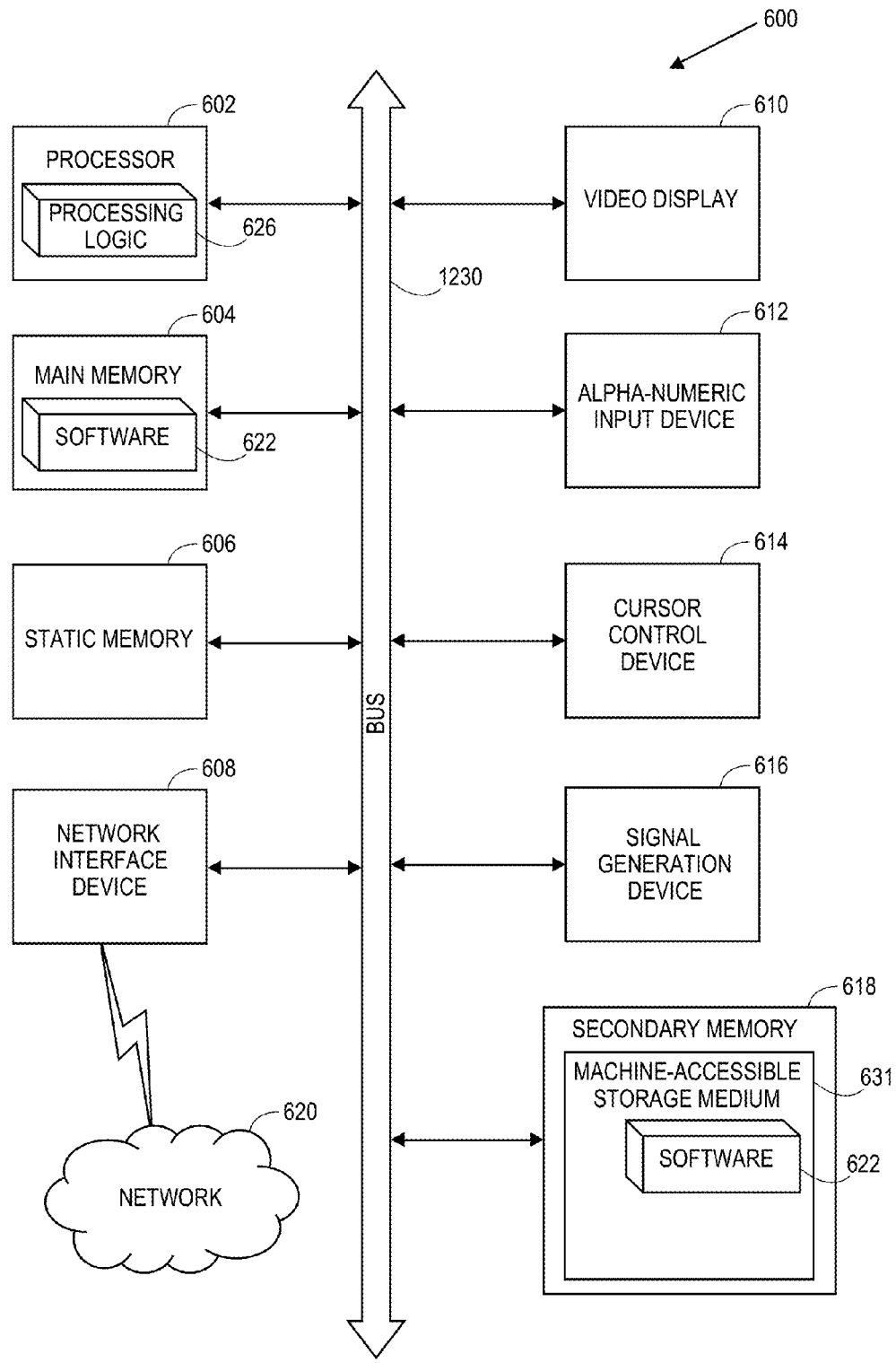
FIG. 6 illustrates a block diagram of an exemplary computer system, in accordance with an embodiment of the present invention.

FIG. 6 illustrates a diagrammatic representation of a machine in the exemplary form of a computer system 600 within which a set of instructions, for causing the machine to perform any one or more of the methodologies discussed herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein. In one embodiment, computer system 600 is suitable for use as computing device 512 described in association with FIG. 5.

The exemplary computer system 600 includes a processor 602, a main memory 604 (e.g., read-only memory (ROM), flash memory, dynamic random access memory (DRAM) such as synchronous DRAM (SDRAM) or Rambus DRAM (RDRAM), etc.), a static memory 606 (e.g., flash memory, static random access memory (SRAM), etc.), and a secondary memory 618 (e.g., a data storage device), which communicate with each other via a bus 630.

Processor 602 represents one or more general-purpose processing devices such as a microprocessor, central processing unit, or the like. More particularly, the processor 602 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 602 may also be one or more special-purpose processing devices such as an application specific integrated circuit (ASIC), a field programmable gate array (FPGA), a digital signal processor (DSP), network processor, or the like. Processor 602 is configured to execute the processing logic 626 for performing the operations discussed herein.

The computer system 600 may further include a network interface device 608. The computer system 600 also may include a video display unit 610 (e.g., a liquid crystal display (LCD) or a cathode ray tube (CRT)), an alphanumeric input device 612 (e.g., a keyboard), a cursor control device 614 (e.g., a mouse), and a signal generation device 616 (e.g., a speaker).

The secondary memory 618 may include a machine-accessible storage medium (or more specifically a computer-readable storage medium) 631 on which is stored one or more sets of instructions (e.g., software 622) embodying any one or more of the methodologies or functions described herein. The software 622 may also reside, completely or at least partially, within the main memory 604 and/or within the processor 602 during execution thereof by the computer system 600, the main memory 604 and the processor 602 also constituting machine-readable storage media. The software 622 may further be transmitted or received over a network 620 via the network interface device 608.

While the machine-accessible storage medium 631 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

In accordance with an embodiment of the present invention, a non-transitory machine-accessible storage medium has instructions stored thereon which cause a data processing system to perform a method of boron-doped carbon-based hardmask etch processing. The method includes etching a boron-doped amorphous carbon layer with a plasma based on a combination of $CH_4/N_2/O_2$ and flourine-rich source such as, but not limited to, $CF_4$, $SF_6$ or $C_2F_6$.

Thus, boron-doped carbon-based hardmask etch processing has been disclosed.

What is claimed is:

1. A method of patterning a film, the method comprising:
   etching a boron-doped amorphous carbon layer with a plasma based on a combination of $CH_4$ and $N_2$ and $O_2$ and a flourine-rich source selected from the group consisting of $CF_4$, $SF_6$ and $C_2F_6$.

2. The method of claim 1, wherein etching the boron-doped amorphous carbon layer comprises using the flourine-rich source to remove boron from the boron-doped amorphous carbon layer by forming a volatile species selected from the group consisting of $BF_x$, $BH_xF_y$, wherein x and y are non-negative numbers.

3. The method of claim 1, wherein etching the boron-doped amorphous carbon layer with the plasma comprises first etching with a first set of plasma conditions, and then etching with a second, different, set of plasma conditions.

4. The method of claim 3, wherein the first etching with the first set of plasma conditions and the etching with the second set of plasma conditions comprises using a same set of gases with differing flow rates for the first and second set of plasma conditions.

5. The method of claim 3, wherein first etching with the first set of plasma conditions comprises etching using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar, and wherein etching with the second set of plasma conditions comprises etching using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar.

6. The method of claim 3, wherein the first etching with the first set of plasma conditions and the etching with the second set of plasma conditions comprises using a same pressure for the first and second set of plasma conditions.

7. The method of claim 6, wherein first etching with the first set of plasma conditions comprises etching at a pressure of approximately 10 mTorr, and with a combination of biases at 2 MHz, 60 MHz and 162 MHz performed at powers of approximately 200 W, 200 W and 100 W, respectively, and wherein etching with the second set of plasma conditions comprises etching at a pressure of approximately 10 mTorr, and with a combination of biases at 2 MHz, 60 MHz and 162 MHz performed at powers of approximately 200 W, 200 W and 2300 W, respectively.

8. The method of claim 1, wherein the boron-doped amorphous carbon layer comprises greater than approximately 25 wt % boron and greater than approximately 50 wt % carbon.

9. A method of patterning a film, the method comprising:
   etching a boron-doped amorphous carbon layer with a plasma based on a combination of $CH_4/N_2/O_2$ and a flourine-rich source selected from the group consisting of $CF_4$, $SF_6$ and $C_2F_6$, the etching comprising:
     etching with a first set of plasma conditions using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar, at a pressure of approximately 10 mTorr, and with a combination of biases at 2 MHz, 60 MHz and 162 MHz performed at powers of approximately 200 W, 200 W and 100 W, respectively; and, then,
     etching with a second set of plasma conditions using a chemistry based on approximately 40 sccm COS, approximately 105 sccm $O_2$, approximately 20 sccm $CF_4$, approximately 20 sccm $N_2$, approximately 50 sccm $CH_4$, and approximately 100 sccm Ar, at a pressure of approximately 10 mTorr, and with a combination of biases at 2 MHz, 60 MHz and 162 MHz performed at powers of approximately 200 W, 200 W and 2300 W, respectively.

10. The method of claim 9, wherein etching the boron-doped amorphous carbon layer comprises using the flourine-rich source to remove boron from the boron-doped amorphous carbon layer by forming a volatile species selected from the group consisting of $BF_x$, $BH_xF_y$, wherein x and y are non-negative numbers.

11. The method of claim 9, wherein the boron-doped amorphous carbon layer comprises greater than approximately 25 wt % boron and greater than approximately 50 wt % carbon.

12. The method of claim 9, further comprising:
   prior to etching the boron-doped amorphous carbon layer with the plasma, depositing the boron-doped amorphous carbon layer above a substrate using a hydrocarbon precursor selected from the group consisting of methane ($CH_4$), propylene ($C_3H_6$), propyne ($C_3H_4$), propane ($C_3H_8$), butane (GPO, butylenes ($C_4H_8$), butadiene ($C_4H_6$), acetelyne ($C_2H_2$), toluene ($C_7H_8$ ($C_6H_5CH_3$)) and mixtures thereof, with diborane ($B_2H_6$).

13. A method of patterning a film, the method comprising:
   etching a boron-doped amorphous carbon layer with a plasma based on a gas selected from the group consisting of $CH_4$, $N_2$ and $O_2$, and based on a flourine-rich source selected from the group consisting of $CF_4$, $SF_6$ and $C_2F_6$, wherein etching the boron-doped amorphous carbon layer with the plasma comprises first etching with a first set of plasma conditions, and then etching with a second, different, set of plasma conditions, and wherein the first etching with the first set of plasma conditions and the etching with the second set of plasma conditions comprises using a same set of gases with differing flow rates for the first and second set of plasma conditions.

14. The method of claim 13, wherein etching the boron-doped amorphous carbon layer comprises using the flourine-rich source to remove boron from the boron-doped amorphous carbon layer by forming a volatile species selected from the group consisting of $BF_x$, $BH_xF_y$, wherein x and y are non-negative numbers.

15. The method of claim 13, wherein the boron-doped amorphous carbon layer comprises greater than approximately 25 wt % boron and greater than approximately 50 wt % carbon.

16. A method of patterning a film, the method comprising:
   etching a boron-doped amorphous carbon layer with a plasma based on a gas selected from the group consisting of $CH_4$, $N_2$ and $O_2$, and based on a flourine-rich source selected from the group consisting of $CF_4$, $SF_6$ and $C_2F_6$, wherein etching the boron-doped amorphous carbon layer with the plasma comprises first etching with a first set of plasma conditions, and then etching with a second, different, set of plasma conditions, wherein the first etching with the first set of plasma conditions and the etching with the second set of plasma conditions comprises using a same pressure for the first and second set of plasma conditions, and wherein first etching with the first set of plasma conditions comprises etching at a pressure of approximately 10 mTorr, and with a combination of biases at 2 MHz, 60 MHz and 162 MHz performed at powers of approximately 200 W, 200 W and 100 W, respectively, and wherein etching with the second set of plasma conditions comprises etching at a pressure of approximately 10 mTorr, and with a combination of biases at 2 MHz, 60 MHz and 162 MHz performed at powers of approximately 200 W, 200 W and 2300 W, respectively.

17. The method of claim 16, wherein etching the boron-doped amorphous carbon layer comprises using the flourine-rich source to remove boron from the boron-doped amorphous carbon layer by forming a volatile species selected from the group consisting of $BF_x$, $BH_xF_y$, wherein x and y are non-negative numbers.

18. The method of claim 16, wherein the boron-doped amorphous carbon layer comprises greater than approximately 25 wt % boron and greater than approximately 50 wt % carbon.

* * * * *